(12) United States Patent
Jiang et al.

(10) Patent No.: US 10,627,098 B2
(45) Date of Patent: Apr. 21, 2020

(54) LED FILAMENT AND LED LIGHT BULB HAVING THE SAME

(71) Applicant: JIAXING SUPER LIGHTING ELECTRIC APPLIANCE CO., LTD, Zhejiang (CN)

(72) Inventors: Tao Jiang, Zhejiang (CN); Wenjang Jiang, Zhejiang (CN); Hong Xu, Zhejiang (CN)

(73) Assignee: JIAXING SUPER LIGHTING ELECTRIC APPLIANCE CO., LTD., Zhejiang (CN)

( * ) Notice: Subject to any disclaimer, the term of this patent is extended or adjusted under 35 U.S.C. 154(b) by 154 days.

(21) Appl. No.: 15/992,786

(22) Filed: May 30, 2018

(65) Prior Publication Data

US 2018/0274773 A1 Sep. 27, 2018

Related U.S. Application Data

(63) Continuation of application No. 15/168,541, filed on May 31, 2016, now Pat. No. 9,995,474.

(30) Foreign Application Priority Data

Jun. 10, 2015 (CN) .......................... 2015 1 0316656
Jun. 19, 2015 (CN) .......................... 2015 1 0347410
(Continued)

(51) Int. Cl.
*F21V 29/70* (2015.01)
*F21K 9/232* (2016.01)
(Continued)

(52) U.S. Cl.
CPC .............. *F21V 29/70* (2015.01); *F21K 9/232* (2016.08); *F21Y 2107/00* (2016.08); *F21Y 2115/10* (2016.08); *H01L 33/501* (2013.01)

(58) Field of Classification Search
CPC ...... F21V 29/70; F21K 9/232; F21Y 2107/00; F21Y 2115/10; H10L 33/501
(Continued)

(56) References Cited

U.S. PATENT DOCUMENTS 8,455,895 B2  6/2013  Chai et al.
8,933,619 B1  1/2015  Ou
(Continued)

FOREIGN PATENT DOCUMENTS

CN  201448620 U  5/2010
CN  101826588 A  9/2010
(Continued)

*Primary Examiner* — Paultep Savusdiphol
(74) *Attorney, Agent, or Firm* — Andrew M. Calderon; Roberts Calderon Safran & Cole, P.C.

(57) ABSTRACT

A LED filament comprises a frame, a metal electrode, a fasten member, a second fasten member, at least one LED chip. The frame is a bottomless frame and the metal electrode is disposed on one side of the frame. The first fasten member is formed on the frame and the second fasten member formed on the metal electrode. The metal electrode having the second fasten member is placed on the first fasten member of the frame, thereby fastening the metal electrode on the frame; wherein one of the first fasten member and the second fasten member is a protrusion while the other one is a hole. The at least one LED chip disposed inside the frame and electrically connecting to the metal electrode.

20 Claims, 8 Drawing Sheets

(30) Foreign Application Priority Data

| | | |
|---|---|---|
| Aug. 17, 2015 | (CN) | 2015 1 0502630 |
| Dec. 19, 2015 | (CN) | 2015 1 0966906 |
| Apr. 29, 2016 | (CN) | 2016 1 0281600 |

(51) Int. Cl.
*F21Y 115/10* (2016.01)
*F21Y 107/00* (2016.01)
*H01L 33/50* (2010.01)

(58) Field of Classification Search
USPC .................................. 362/249.02, 249.06
See application file for complete search history.

(56) References Cited

U.S. PATENT DOCUMENTS

| | | | |
|---|---|---|---|
| 9,016,900 | B2 | 4/2015 | Takeuchi et al. |
| 9,231,171 | B2 * | 1/2016 | Liu ............... H01L 33/504 |
| 9,287,106 | B1 * | 3/2016 | Miao .................. H01K 3/02 |
| 9,488,767 | B2 | 11/2016 | Nava et al. |
| 9,761,765 | B2 | 9/2017 | Basin et al. |
| 9,982,854 | B2 | 5/2018 | Ma et al. |
| 2004/0008525 | A1 | 1/2004 | Shibata |
| 2009/0184618 | A1 | 7/2009 | Hakata et al. |
| 2012/0119647 | A1 * | 5/2012 | Hsu ...................... F21V 29/70 |
| | | | 315/35 |
| 2012/0176017 | A1 * | 7/2012 | Huang ................ F21V 29/77 |
| | | | 313/46 |
| 2012/0187817 | A1 * | 7/2012 | Chuang ............... F21K 9/232 |
| | | | 313/46 |
| 2013/0058080 | A1 | 3/2013 | Ge et al. |
| 2013/0058580 | A1 | 3/2013 | Wakazono |
| 2013/0147348 | A1 | 6/2013 | Motoya et al. |
| 2013/0235592 | A1 | 9/2013 | Takeuchi et al. |
| 2013/0265796 | A1 | 10/2013 | Kwisthout |
| 2013/0293098 | A1 | 11/2013 | Li et al. |
| 2014/0168020 | A1 * | 6/2014 | Stoytchev ........... F21V 33/0004 |
| | | | 343/721 |
| 2014/0268740 | A1 * | 9/2014 | Veres ..................... H01L 33/54 |
| | | | 362/235 |
| 2014/0268779 | A1 | 9/2014 | Sorensen et al. |
| 2014/0369036 | A1 | 12/2014 | Feng |
| 2015/0069442 | A1 * | 3/2015 | Liu ....................... H01L 33/504 |
| | | | 257/98 |
| 2015/0070871 | A1 | 3/2015 | Chen et al. |
| 2015/0211723 | A1 | 7/2015 | Athalye |
| 2015/0255440 | A1 | 9/2015 | Hsieh |
| 2016/0238199 | A1 | 8/2016 | Yeung et al. |
| 2016/0377237 | A1 | 12/2016 | Zhang |
| 2017/0012177 | A1 | 1/2017 | Trottier |
| 2017/0016582 | A1 | 1/2017 | Yang et al. |
| 2017/0167663 | A1 * | 6/2017 | Hsiao ...................... F21K 9/237 |
| 2017/0227169 | A1 * | 8/2017 | Jiang ........................ F21V 9/30 |

FOREIGN PATENT DOCUMENTS

| | | | |
|---|---|---|---|
| CN | 102121576 A | | 7/2011 |
| CN | 202252991 U | * | 5/2012 ............ F21K 9/232 |
| CN | 202252991 U | | 5/2012 |
| CN | 102751274 A | | 10/2012 |
| CN | 202719450 U | | 2/2013 |
| CN | 101968181 B | | 3/2013 |
| CN | 103123949 A | | 5/2013 |
| CN | 203367275 U | | 12/2013 |
| CN | 103560128 A | | 2/2014 |
| CN | 103682042 A | | 3/2014 |
| CN | 103890481 A | | 6/2014 |
| CN | 203628391 U | | 6/2014 |
| CN | 203656627 U | | 6/2014 |
| CN | 103939758 A | | 7/2014 |
| CN | 103956421 A | | 7/2014 |
| CN | 103972364 A | | 8/2014 |
| CN | 103994349 A | | 8/2014 |
| CN | 203857313 U | | 10/2014 |
| CN | 203880468 U | | 10/2014 |
| CN | 204062539 U | | 12/2014 |
| CN | 104295945 A | | 1/2015 |
| CN | 104319345 A | | 1/2015 |
| CN | 204083941 U | | 1/2015 |
| CN | 104456165 A | | 3/2015 |
| CN | 204289439 U | | 4/2015 |
| CN | 104600174 A | | 5/2015 |
| CN | 104600181 A | | 5/2015 |
| CN | 204328550 U | | 5/2015 |
| CN | 204387765 U | | 6/2015 |
| CN | 104913217 A | | 9/2015 |
| CN | 105042354 A | | 11/2015 |
| CN | 105090789 A | | 11/2015 |
| CN | 105098032 A | | 11/2015 |
| CN | 105140381 A | | 12/2015 |
| CN | 105161608 A | | 12/2015 |
| CN | 105371243 A | | 3/2016 |
| CN | 105609621 A | | 5/2016 |
| CN | 106468405 A | | 3/2017 |
| CN | 106898681 A | | 6/2017 |
| CN | 107123641 A | | 9/2017 |
| CN | 107170733 A | | 9/2017 |
| CN | 206563190 U | | 10/2017 |
| CN | 107314258 A | | 11/2017 |
| CN | 206973307 U | | 2/2018 |
| CN | 207034659 U | | 2/2018 |
| CN | 108039402 A | | 5/2018 |
| CN | 105090782 B | | 7/2018 |
| CN | 207849021 U | | 9/2018 |
| EP | 2535640 A1 | | 12/2012 |
| EP | 2567145 A1 | | 3/2013 |
| EP | 2760057 A1 | | 7/2014 |
| GB | 2547085 A | | 8/2017 |
| JP | 3075689 U | | 2/2001 |
| JP | 2001126510 A | | 5/2001 |
| JP | 2003037239 A | | 2/2003 |
| JP | 2013225587 A | | 10/2013 |
| WO | 2014012346 A1 | | 1/2014 |
| WO | 2014167458 A1 | | 10/2014 |
| WO | 2017037010 A1 | | 3/2017 |

* cited by examiner

LED FILAMENT AND LED LIGHT BULB HAVING THE SAME

CROSS-REFERENCE TO RELATED APPLICATIONS

This application is a continuation application of 15/168,541 filed on May 31, 2016, and claims the priority benefit of the following Chinese Patent Applications: No. 201510316656.9 filed Jun. 10, 2015, No. 201510347410.8 filed Jun. 19, 2015, No. 201510502630.3 filed Aug. 17, 2015, No. 201510966906.3 filed Dec. 19, 2015 and No. 201610281600.9 filed Apr. 29, 2016, the full disclosure of which is incorporated herein by reference.

BACKGROUND

Technical Field

The present disclosure is related to an illumination field, and more particular to a LED filament and a LED Bulb.

Related Art

The LED has advantages of environmental protection, energy saving, high efficiency and long lifespan, and therefore it attracts widespread attention in recent years and gradually replaces the traditional lighting lamp. However, the luminescence of the LED has directivity and cannot may make an illumination with a wide-angle range like the traditional lamp. Accordingly, how to design the LED Bulb with an extremely wide angle and light illuminated the entire circumference effect has become a research and development subject for the LED industry.

In the recent years, a LED light filament, which makes the LED light source lighting similar to traditional tungsten light bulb to achieve a full angle for illumination, is increasingly attracted by the industry. The manufacturing of the LED filament is that a plurality of LED chips are connected in series and fixed on a narrow and slightly long glass substrate, and a silicone gel doped with a phosphor wraps the whole glass substrate and the electrical connection is performed, thereby completing the LED filament. However, a thermal conductivity of the glass substrate is not good and is easily broken due to vibration, thereby disconnecting the series connection of the LED chips to incur the failure. Therefore, a metal substrate, which is not easily broken, is used to replace the glass substrate, but the light cannot penetrate the metal substrate and it has a defect of the light shielding. Thus, the luminous efficiency of the LED filament is low. Accordingly, how to strengthen a robustness of the LED filament substrate and a thermal conducting property of the LED filament substrate as well as the luminous efficiency of the LED filament has become a research and development subject for the LED industry.

SUMMARY

In one embodiment, the present disclosure provides a LED filament, which includes a frame, wherein the frame is a bottomless frame; a metal electrode disposed on one side of the frame; a first fasten member formed on the frame and a second fasten member formed on the metal electrode, wherein the metal electrode having the second fasten member is placed on the first fasten member of the frame, thereby fastening the metal electrode on the frame, wherein one of the first fasten member and the second fasten member is a protrusion while the other one is a hole; and at least one LED chip disposed inside the frame and electrically connecting to the metal electrode.

In another embodiment, the present disclosure provides a LED light bulb, which includes a bulb housing having an opening; a metal stem, swapping the air in the LED light bulb and providing a function of thermal conductivity for the light bulb; a heat sink, connecting with the opening of the light bulb housing and having a cover near the opening of the bulb housing for supporting the metal stem and transmitting the thermal transmitted by the metal stem outside the LED light bulb; a bulb holder, connecting to the heat sink; and a metal conductive support, disposed on the cover of the heat sink for supporting and electrically connecting with a plurality of filaments; wherein each of the plurality of filaments comprises a frame, a metal electrode disposed on one sides of the frame, a first fasten member formed on the frame and a second fasten member formed on the metal electrode, at least one LED chip disposed inside the frame and electrically connecting to the metal electrode; wherein the metal electrode having the second fasten member is placed on the first fasten member of the frame, thereby fastening the metal electrode on the frame; wherein one of the first fasten member and the second fasten member is a protrusion while the other one is a hole.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The above and other exemplary aspects, features and advantages of certain exemplary embodiments of the present disclosure will be more apparent from the following description taken in conjunction with the accompanying drawings, in which.

DETAILED DESCRIPTION

Figure 1A:
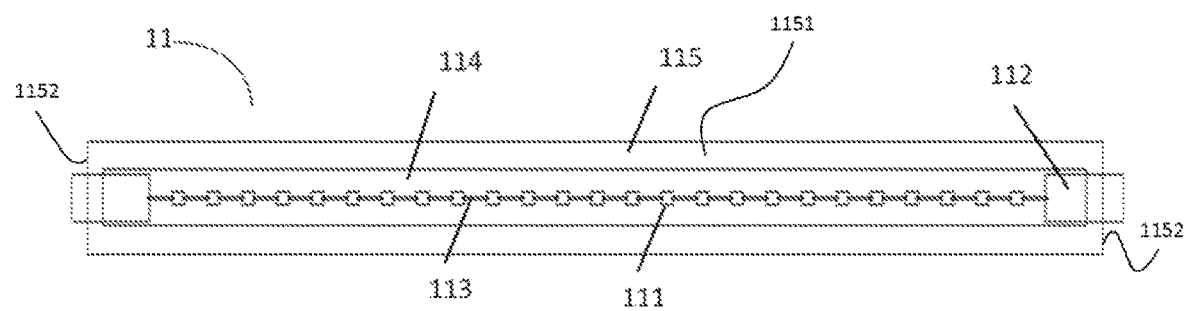
FIG. 1A is a schematic view of a LED filament with a plurality of LED chips connected in series according to a first embodiment of the present disclosure.

The present disclosure will now be described more fully hereinafter with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The following description with reference to the accompanying drawings is provided to explain the exemplary embodiments of the disclosure. Note that in the case of no conflict, the embodiments of the present disclosure and the features of the embodiments may be arbitrarily combined with each other.

FIG. 1A shows a schematic view of a LED filament 11 disposed inside a LED light bulb according to the present disclosure. The LED filament 11 includes a frame 115, metal electrodes 112 respectively disposed on two sides of the frame 115, a LED chip assembly including a plurality of LED chips 111 disposed inside the frame 115, gold wires 113 connecting the chips 111 in the LED chip assembly, and a silicone gel 114 wrapping the LED chips 111 and the gold wires 113 inside the frame 115.

The frame 115 includes two holding sides 1152 and two non-holding sides 1151. The frame 115 is a bottomless frame and has a length between 10 to 40 mm, a width between 2 to 5 mm and a thickness between 0.3 to 2 mm. The transparency of the frame 115 is defined such that the transmittance of the visible light of the frame 115 is preferably greater than 50%. The material of the frame 115 is a thermostable and light transmissive material, and it may be selected from thermostable transparent silicone gel or various kinds of plastics with the similar property, and a photo refractivity thereof is between the silicone gel wrapping the LED chips 111 of the LED chip assembly and the air. Since the frame 115 is bottomless, it may not shield light omni-directionally, thereby increasing the luminous efficiency of the filament 11. In one embodiment, a phosphor may also appropriately be incorporated into the frame 115, so as to serve as a light-emitting support. In other words, each sides of the plurality of LED chips 111 according to the present disclosure contacts the gel 114. Metal members are respectively embedded on the two holding sides 1152 of the frame 115 to serve as the metal electrodes 112 of the filament 11. The size of the metal members is about 3×1 mm2, the thickness of the metal members is 0.4 mm. The middle of the metal members may be configured with some vias. During the process for manufacturing the frame 115 by way of, for example, the insert molding technique, the metal members may be embedded in a cavity, and the material served as the support penetrates these vias and then condenses, to facilitate well the stability of the metal electrodes 112 disposed on the frame 115. An outside terminal of the metal electrodes 112 on the frame 115 may be configured with a via or a hook (not shown in the figure) for the electrical connection when the LED filament 11 is assembled as the blub. Metal conductive lines may be disposed on the frame 115, for electrical connection with the LED chips 111 in the middle of the frame 115.

The LED chip assembly may be placed on a carrier in advance, and the LED chips 111 may be connected in series by the gold wires to form a LED string. Then, the LED string may be moved to the middle of the frame 115, and the first and the last LED chips 111 of the LED string are connected to the metal electrodes 112 on the two sides of the frame 115 through the gold wires. From the above of the frame 115, a high thermal conductivity silicone gel 114 doped with the phosphor is coated on the middle of frame 115 and covers all of the LED chip assembly and parts of the metal electrodes 112 inside the frame 115. Then, the carrier under the LED chip assembly is removed, and from the back of the frame 115, the high thermal conductivity silicone gel 114 doped with the phosphor continues to be injected into the middle of the frame 115 to substantially and completely wrap the LED chip assembly. After the silicone gel 114 is cooled and condenses, the production of the LED filament 11 with the frame 115 is completed. The afore-mentioned carrier may select a silicone gel board with higher hardness, which may be cut into strips and then used. Therefore, there is no need to remove the carrier and then inject high thermal conductivity silicone gel 114 from the back of frame 115, thereby simplifying the filament 11 process steps.

The LED chip assembly may be formed by a single LED chip 111, or may also be formed by a plurality of LED chips 111. In one embodiment, a long-strip type may be an option for the LED chip 111. The long-strip type chip does not have the problem of current diffusion uniform distribution. Therefore, an extended electrode is not required on the original electrode to help the current diffusion. The excess electrodes may shield the illumination of the LED chip, thereby affecting the illumination efficiency. For example, the specification of the LED chip 111, such as 10×20, is very suitable. In a case of one LED filament with up to 40 mm, eighteen LED chips may be disposed on the LED filament after each intervals between two LED chips is deducted. Moreover, a conductive transparent layer of indium tin oxide may be coated on the surface of the LED chips 111, therefore the current uniform diffusion distribution and the illumination efficiency of the chip may also be increased.

Figure 1B:
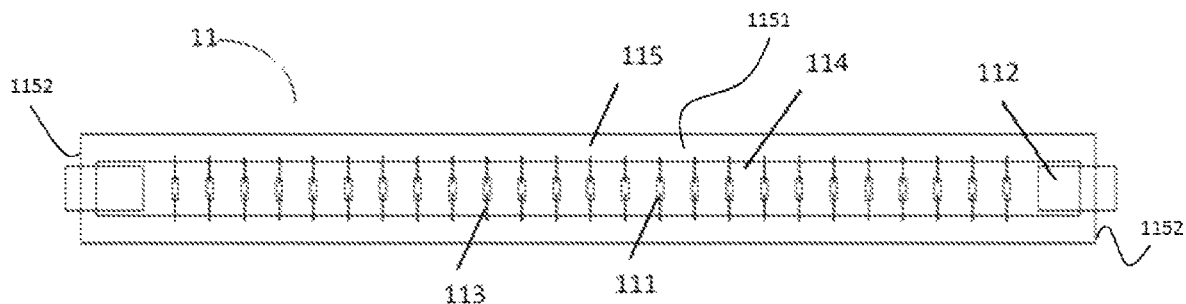
FIG. 1B is a schematic view of a LED filament with a plurality of LED chips connected in parallel according to the first embodiment of the present disclosure.

FIG. 1B is a schematic view of a LED filament 11 with a plurality of LED chips 111 connected in parallel according to the first embodiment of the present disclosure. The different between FIG. 1A and FIG. 1B is that the LED chips 111 of FIG. 1A are connected in series, and the LED chips of FIG. 1B are connected in parallel. The manufacturing process of the LED filament 11 of FIG. 1B is similar to that of FIG. 1A, it may refer to the description of the embodiment of FIG. 1A, thus the description thereof is omitted.

In this embodiment, the frame is, for example, a hollow and bottomless frame, as shown in FIGS. 1A and 1B. However, the present disclosure is not limited to the frame 115, and thus the frame 115 may also have other forms. One of the embodiments is described as follows.

Figure 1C:
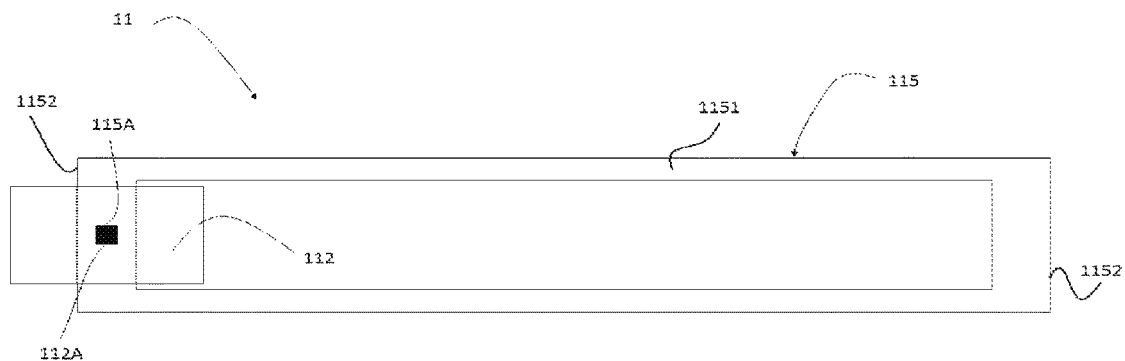
FIG. 1C is a schematic view of a LED filament with a plurality of LED chips showing the two metal electrodes fastened on the transparent frame according to the first embodiment of the present disclosure.

FIG. 1C is a schematic view of a LED filament with a plurality of LED chips 111 showing the two metal electrodes 112 fastened on the transparent frame 115. The structure of the LED filament 11 shown in FIG. 1C may be applicable for the LED filament in FIG. 1A or FIG. 1B.

The fasten means includes a protrusion 115A formed on the frame 115 and a hole 112A corresponding to the protrusion 115A formed on the metal electrode 112. When assembling the LED filament 11, the metal electrode 112 having the hole 112A placed on the protrusion 115A of the frame 115, thereby fastening the metal electrode 112 on the frame 115 to facilitate the assembly process.

Figure 1D:
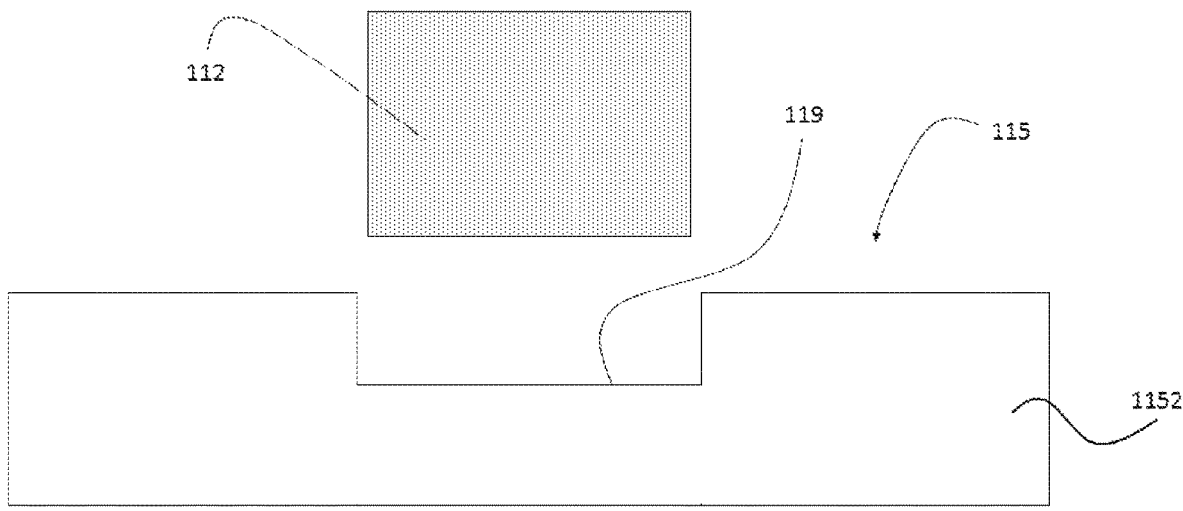
FIG. 1D is a side view of a frame according to another embodiment of the present disclosure.

FIG. 1D is a side view of a frame according to another embodiment of the present disclosure. In FIG. 1D, two holding platforms 119 are formed on the two holding sides 1152 of the frame 115 for holding the two metal electrodes 112 respectively. The LED chip assembly is connected by the gold wire 113 in series and connected to the metal electrodes 112 on the holding platforms 119, and the silicone gel 114 is injected to substantially and completely wrap the LED chip assembly and the gold wire 113. In other words, each sides of the plurality of LED chips 111 according to the present disclosure contacts the silicone gel 114. The configuration of the two metal electrodes 112 on the two metal electrodes 112 is applicable for the embodiment in FIG. 1A and FIG. 1B.

Figure 2:
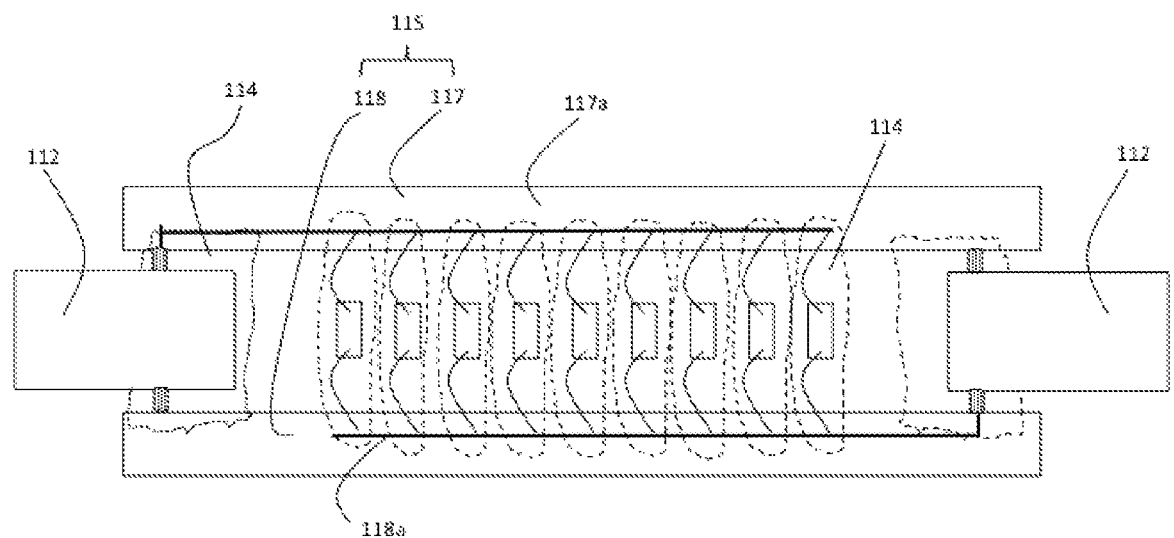
FIG. 2 is a schematic view of a LED filament with a plurality of LED chips connected in parallel according to another embodiment of the present disclosure.
Figure 3:
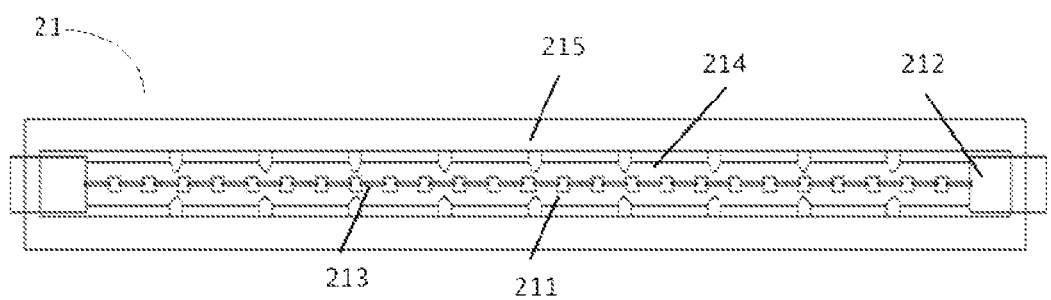
FIG. 3 a schematic view of a LED filament with a plurality of LED chips connected in series according to a second embodiment of the present disclosure.
Figure 4:
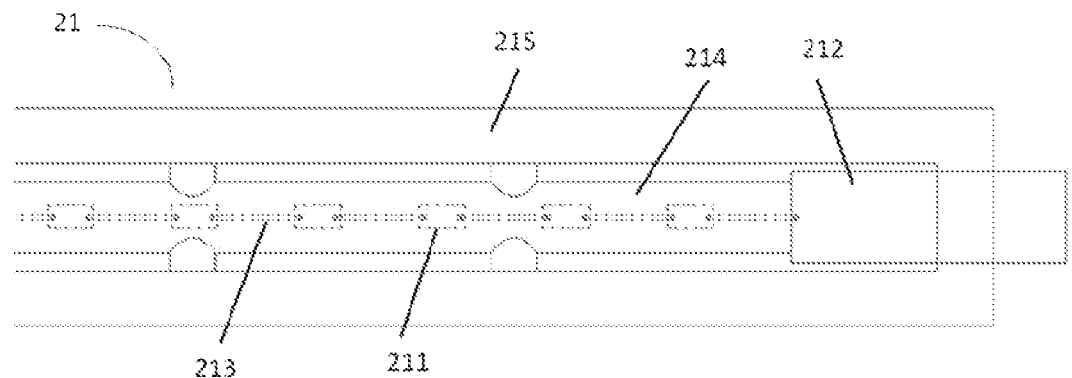
FIG. 4 is a partial enlarged view of FIG. 3.

FIG. 2 is a schematic view of a frame according to yet another embodiment of the disclosure. In FIG. 2, the frame 115 is formed by two frame plates 117, 118 arranged in parallel. The LED chip assembly having a plurality of LED chips 111 and the metal electrodes 112 are disposed between the two frame plates, and the LED chips 111 are connected by the gold wire 113 in parallel and connected to the metal electrodes 112. The silicone gel 114 injects into a position between the two frame plates 117, 118 of the frame 115 to substantially and completely wrap the LED chip assembly 111 and the gold wire 113. In this embodiment, a first conducting wiring 117 a formed in the frame plate 117 electrically connects the positive terminals of the LED chips 111 to one of the metal electrodes 112, and a second conducting wiring 118 an electrically connects the negative terminals of the LED chips 111 to the other one of the metal electrodes 112. In one embodiment, a fasten means is configured to fasten the two metal electrodes 112 between the two frame plates 117 and 118.

In one embodiment, the LED filament further comprises a transparent auxiliary carrier for supporting the LED chip assembly.

In one embodiment, the frame plates 117 and 118 further comprise a plurality of auxiliary supports, and each of the auxiliary supports holds each of the LED chips 111 respectively.

FIG. 3 to FIG. 6 show a schematic view of a LED filament according to another embodiment of the present disclosure. The above manufacturing method is slightly changed. After the LED string and the metal electrodes 212 on the two sides of the frame 215 are electrically connected by gold wires, the carrier under the LED chip assembly 211 may be removed firstly, and then the LED string and the frame 215 are put into a mold together. A high thermal conductivity silicone gel 214 doped with the phosphor is then injected into to fill the interior of the frame 215 by the molding manner, so as to completely wrap the LED string, thereby completing the production of the LED filament 21 with the frame 215. However, when the silicone gel 214 is injected into the interior of the frame 215, the silicone gel 214 does not necessarily fill all interior spaces of the whole frame 215, as long as it may appropriately wrap all of the LED chip assembly, as shown in FIG. 3 to FIG. 6. By the design of the molding mold or the change of the silicone gel coating method, the injected silicone gel 214 does not fill all of the interior of the frame 215. The gel 214 only completely wraps the LED chips 211, the gold wires 213 and parts of the metal electrodes 212 inside the frame 215. In another embodiment, a lens may be further formed on the outer layer of the chip for adjusting the light angle. By way of not completely filling the frame 215, the vacated space makes the LED string to easily dissipate heat. Since the LED chips 211 of the LED chip assembly inside the filament 21 are connected by the gold wires 213, and the gold wires 213 have excellent ductility, it may timely release the extrusion stress of the LED chips 211 inside the LED string, thus the problem of the electrical disconnection is easily avoided.

Figure 5:
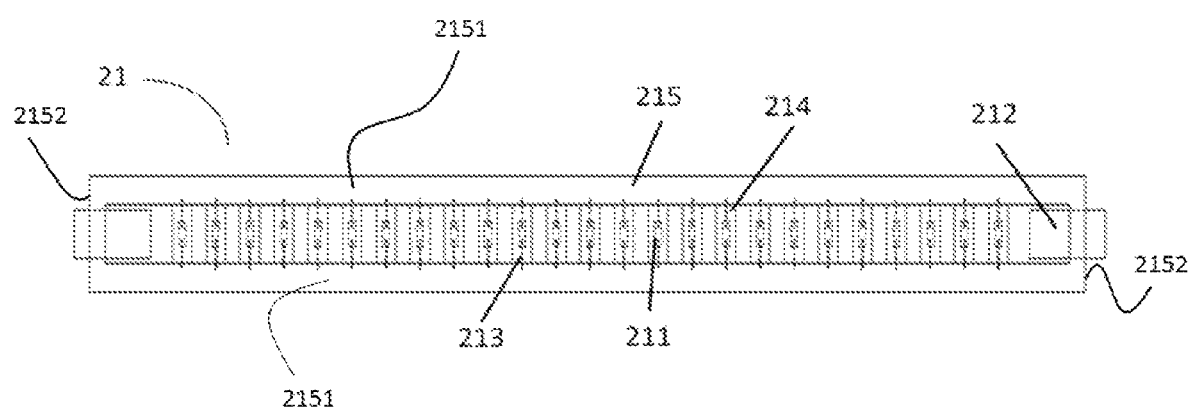
FIG. 5 is schematic view of a LED filament with a plurality of LED chips connected in parallel according to the second embodiment of the present disclosure.
Figure 6:
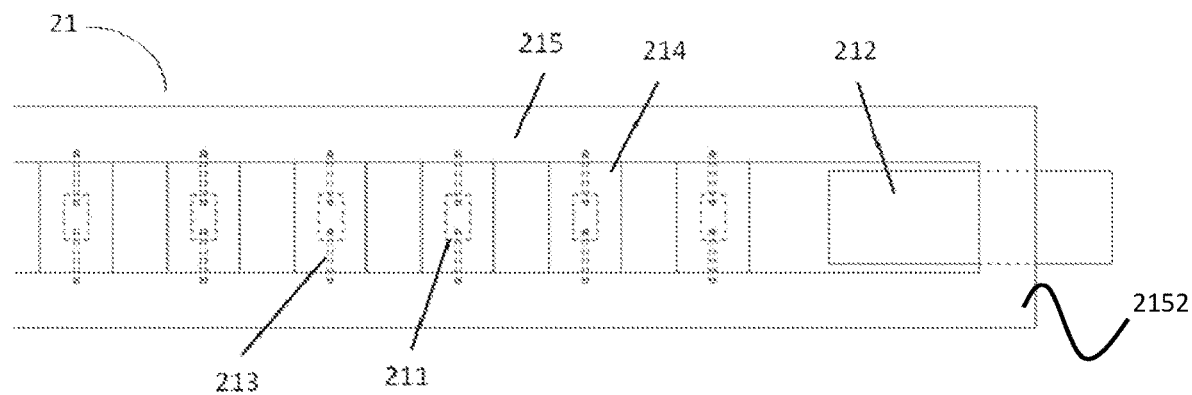
FIG. 6 is a partial enlarged view of FIG. 5.

The above LED string is formed by way of electrical connection in series. However, the connection manner between the LED chips 211 in the LED chip assembly is not limited to this mode. The electrical connection of the LED chips 211 may be completed by the metal conductive lines (not shown) embedded in the frame 215. In FIG. 5, for example, all positive electrodes of the LED chips 211 are connected to the metal conductive lines on the upper side of the frame 215 by the gold wires 213 and then connected to the metal electrode 212 at one holding side 2152 of the frame 215 by the metal conductive lines. Similarly, all negative electrodes of the LED chips 211 are connected to the metal conductive line on the lower side of the frame 215 and then connected to the metal electrode 212 at the other holding side 2152 of the frame 215. Therefore, the LED string is formed by electrical connection in parallel. However, the electrical connection of the chips of the LED string is not limited to these two modes. It may use a plurality of chips connected in serial to form a unit, and then use a plurality of the units to connect to the metal conductive lines on the frame 215 by the gold wires 213, so as to form the LED string with the electrical connection in parallel.

Figure 7:
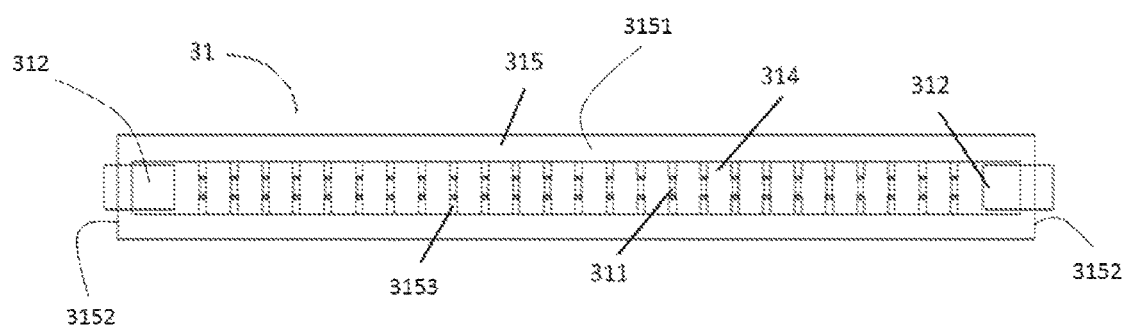
FIG. 7 a schematic view of a LED filament according to a third embodiment of the present disclosure.
Figure 8:
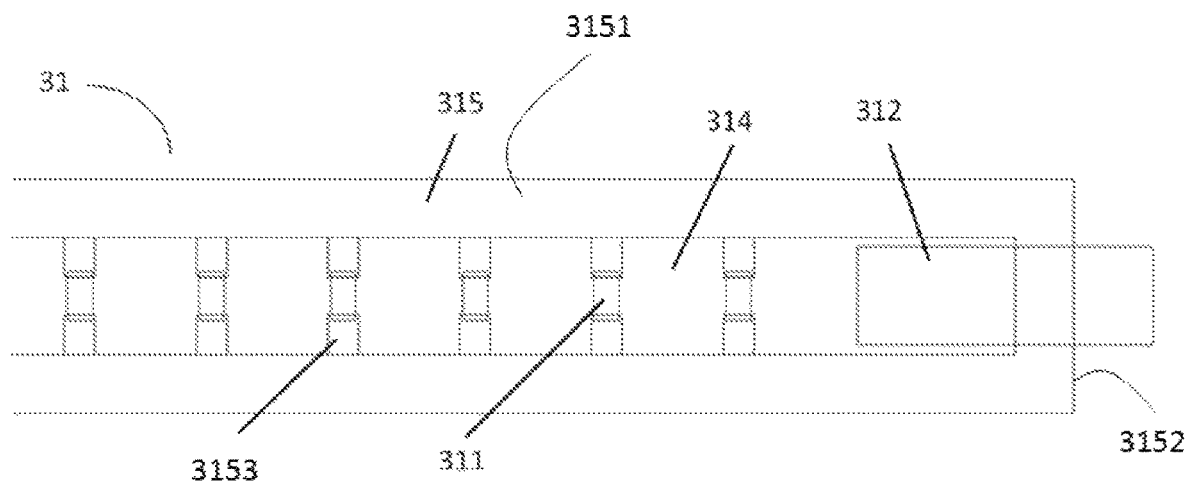
FIG. 8 is a partial enlarged view of a LED filament according to the third embodiment of the present disclosure.

FIG. 7 and FIG. 8 show schematic views of a LED filament according to another embodiment of the present disclosure. The frame 315 of the filament is also a bottomless frame, and the material thereof is a thermostable and light transmissive material, and it may select from high temperature transparent silicone gel or various plastics with the similar property.

As shown in FIG. 7 and FIG. 8, the difference between this embodiment and the above embodiment is that the interior of the frame 315 includes a plurality of auxiliary supports 3153 correspondingly protruded from the two non-holding sides 3151 of the transparent frame 315, used to support the LED chips 311 respectively. Since the frame 315 is bottomless, it may not shield the light, thereby increasing the illumination efficiency of the LED filament 31. As the same description of the above embodiment, two metal members are disposed at the two holding sides 3152 of the frame 315 to serve as metal electrodes 312 of the filament 31. A size of the metal members is the same as the above description. A middle of the metal members may be configured with some vias, and during manufacturing the frame 315, for example, using an insert molding technique, the metal members may be embedded in a cavity, and the material served as the frame 315 penetrates these vias and then condenses, to facilitate the stability of the metal electrodes 312 disposed on the support. Metal conductive lines may be also disposed on the frame 315 and the protruded auxiliary support 3153, and subsequently electrically connect with the LED chips 311 in the middle of the frame 315. Since the metal conductive lines may also disposed on the auxiliary support 3153, besides the gold wires used for electrically connecting the LED chips 311 of the present disclosure, it may also select a flip-chip structure manner to form the electrically connection, so as to avoid the inconvenience for using the gold wires. The coating manner of the silicone gel 314 may also coat the peripheral of a single LED chip 311 and does not require to fill the interior of the whole frame 315, as long as it completely wraps the LED chip assembly. It even forms a lens for adjusting a lighting angle on the outer layer of the chip, such that the vacated space makes the LED string to dissipate heat easily.

In the traditional LED filament, after completing the manufacturing process of all chips, the epitaxial wafer needs to be cut to separately form chips one by one. In the present disclosure, the epitaxial wafer does not need to be cut to separately form chips one by one. In one embodiment, a plurality of LED chips may be combined to form a small unit. And the plurality of the preferred LED chip assembly may be arranged to form a LED light bar with a long-strip type, such that it is more suitable for the LED light source. Therefore not only multi-chip cutting steps may be saved during the LED chip process, but also a quantity of solid crystal wire may also be saved during the LED chip package process. Thus, it may help to increase of the whole process yield and quality. In addition, a sapphire substrate of the epitaxial wafer may be used to replace a conventional glass substrate. It does not need additionally attaching the LED chip to other substrate or support, and a thermal conductivity coefficient of the sapphire substrate is up to 120 W/mK which is much better than the conventional glass with 1 W/mK, such that it has a big advantage on the increase of the heat dissipation efficiency and the luminous efficiency of the LED chip assembly on the filament. The LED chip assembly on the LED light bar may be electrically connected by the gold wires in the package technology, and may be connected by plating the metal conductive lines in the semiconductor process technology.

After completing the LED light bar, bottom parts of the two sides of the LED light bar may be attached with metal electrodes by a high thermally conductive gel or solder paste, and the LED chips and the metal electrodes of the two sides of the LED light bar may be electrically connected by the gold wires in the package wire technology or the metal electrodes of the two sides of LED light bar may also bonded in the flip-chip package manner. Finally, the LED light bar configured with the metal electrodes is put into the mold, and the silicone gel doped with the phosphor then wraps the periphery of the LED light bar in the molding manner. Thus, the production of the LED filament is completed. A size of the metal electrodes is the same as the above description. The middle of the metal electrodes may be configured with some vias. The silicone gel may penetrate these vias and then condenses in the molding process, such that a stability of the metal electrodes has a good help.

Figure 9:
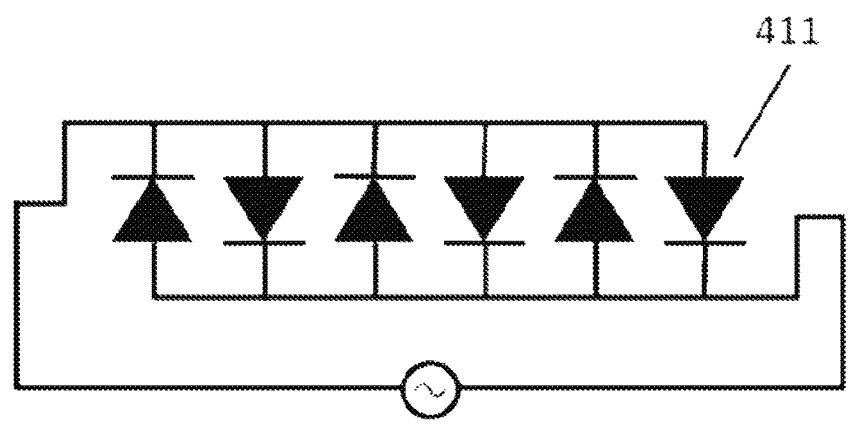
FIG. 9 is a schematic view of a plurality of LED chips connected in parallel according to a fourth embodiment of the present disclosure.

Further, in all embodiments of the present disclosure, a long-strip type LED is an option for the LED chip. As the above description, the LED chip assembly may be formed by a single LED chip, and may also be formed by the plurality of LED chips. The long-strip type LED does not have the problem of current distribution. Therefore, it does not require an extend electrode on the original electrode to help the current diffusion. The excess electrodes may shield the illumination of the LED chip, thereby affecting the illumination efficiency. The LED chip with the long strip type is more conformed to the requirement of the structural shape of the LED filament. In one embodiment, an aspect ratio of the LED chip may be set to 2:1~10:1. In addition, considering the problem of the thermal dissipation, the arrangement of the LED chips inside the long strip LED chip assembly may not be too dense, and the interval therebetween should be 1~3 mm at least. Or, when the LED chips inside the LED chip assembly are configured not to light at the same time, i.e. they are lighting in turn, or all the LED chips insides the LED chip assembly may not be lighted, thereby decreasing the thermal source. The part of LED chip not lighted may be used for other purpose. For example, a plurality of LED chips may be selected to form a bridge rectifier circuit, so as to transform an AC voltage to a DC voltage to supply to the LED chips. In another embodiment, the connection of the LED chip assembly may be adjusted to the parallel electrical connection, as shown in FIG. 9. In the LED chip assembly electrically connected in parallel as shown in FIG. 2 and FIG. 5, a part of the positive electrodes and the negative electrodes of the LED chip assembly 411 is reversely in parallel connected to the conductive lines on the frame. When the LED filament is connected to the AC voltage source, the LED chip assembly 411 at the forward current are lighted, and the LED chip assembly 411 at the reverse current are not lighted. Therefore all the LED chip assembly 411 may be lighted in turn during the transformation between the positive period and the negative period of the AC voltage source, thereby decreasing the thermal source generation of the LED chip assembly 411 and decreasing the cost of the rectifier electronic components at the same time.

In another embodiment, the LED chip assembly may also use high power LED chips to be operated at the low current. Although the LED chip assembly maintain at the low current density, they still have sufficient brightness, and the LED chip assembly may not generate a large amount of thermal source, such that the whole luminous efficiency is good.

However, the LED chips of the present disclosure are not limited to the range of the LED chips described above. For example, AC type light emitting diode (AC LED) and high voltage type light emitting diode (HV LED) are also options for manufacturing the LED filament. Since the LED illumination apparatus must use a commercial power, and the power provided by the market is a high voltage AC power source and the high voltage AC power source is not suitable to directly supply to the LED light source. Thus the LED illumination apparatus needs additional electronic components for rectifying and voltage lowering. Since the LED is a diode element, and the appropriate combination of the LED may achieve the rectifying effect. A plurality of LEDs connected in series is similar to a plurality of resistors connected in series, and therefore the AC LED and the HV LED are very suitable to manufacture the LED filament, thereby decreasing the cost of the electronic components for rectifying and voltage lowering.

Figure 10:
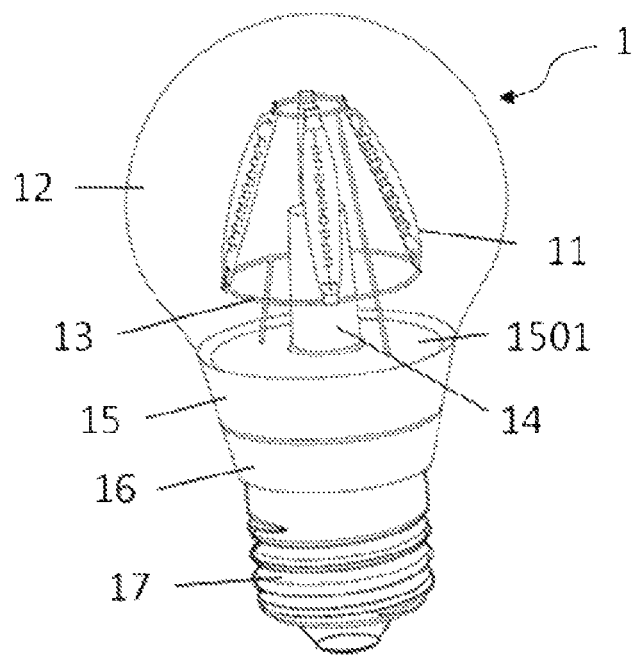
FIG. 10 is a schematic view of a LED light bulb manufactured by applying the LED filament according to an embodiment of the present disclosure.

During the manufacturing process of the traditional light bulb, in order to avoid a tungsten filament is burned in the air to incur an oxidation break failure, a glass structure with a horn stem is designed to cover an opening of a glass bulb housing to seal sintering, and a port of the horn stem is connected to a vacuum pump to swap the air as an nitrogen gas in the interior of the bulb housing, so as to avoid the tungsten filament inside the bulb housing from being burned and oxidized, and then the port of the horn stem is seal sintered. In addition, when the gas is swapped, a water mist in the air inside the bulb housing may also be removed. Further, please refer to FIG. 10. FIG. 10 shows a LED light bulb 1 of the LED filament 11 by using the above process. The LED light bulb 1 includes a bulb housing 12, a plurality of LED filaments 11, a metal conductive support 13 for connecting to and supporting the LED filaments 11, a metal stem 14 for swapping the air in the LED light bulb 11 and providing a function of thermal conductivity for the light bulb 11, a heat sink 15 for connecting with the light housing 12 and the metal stem 14 and transmitting the thermal transmitted by the metal stem 14 outside the LED light bulb 1, a plastic bulb holder 16 for connecting to the heat sink 15, a bulb base 17 and a driving circuit (not shown in the figure) disposed in the bulb base 17. In order to increasing the light efficient performance of LED light bulb 1, the bulb housing 12 must have a better transparency and thermal conductivity effect. Therefore, in the present disclosure, a glass bulb housing is used, and a plastic bulb housing with high transparency and high thermal conductivity effect may be selected. Considering a requirement of low color temperature light bulb on the market, the interior of the bulb housing 12 may be appropriately doped with a golden yellow material or a surface inside the bulb housing 12 may be plated a golden yellow thin film for appropriately absorbing a trace of blue light emitted by a part of the LED chip, so as to downgrade the color temperature performance of the LED bulb 1. As the above description, the vacuum pump may swap the air as the nitrogen gas or a mixture of nitrogen gas and helium gas in an appropriate proportion in the interior of the bulb housing 12 through the metal stem 14, so as to improve the thermal conductivity of the gas inside the bulb housing 12 and also remove the water mist hid in the air. In addition, for lack of the thermal conductivity by the metal frame, heat generated by the LED filament 11 does not easily transmit to the exterior of the bulb housing 12. However, a thermal source radiated by the LED filament 11 is absorbed by the metal stem 14, so as to immediately transmit the thermal to the heat sink 15 to dissipate outside the bulb housing 12. Moreover, if considering for increasing the light efficient performance, it may use a traditional glass stem not absorbing light, and a surface thereof may be plated a layer of graphene with a light transmissive and a high thermal conductivity property, so as to improve the heat dissipation problem. The heat sink 15 is a slightly hollow cylinder surrounding the opening of the bulb housing 12, and the interior thereof may be equipped with the driving circuit of the LED filament 11, and the material thereof may select from a metal, a ceramics, or a plastic with a good thermal conductivity effect. When the metal material (such as Al) is used for the heat sink 15, since the thermal conductivity property of the metal material is good, but the thermal radiation property thereof is bad (such as, the radiation rate of Al is only about 0.1), a surface thereof needs a coated layer to increase the radiation effect. For example, an aluminum oxide (the radiation rate is about 0.4) has a better thermal radiation effect. The heat sink 15 is equipped with a cover 1501 near the opening of the bulb housing 12, a surface of the cover may be coated with the aluminum oxide or a white reflective coating to increase a thermal conductive area of the heat sink 15 and improve the thermal radiation property, so as to fully absorb the thermal generated by the LED filament 11 and transmit the thermal outside the bulb housing 12, and reflect the light emitted by the LED filament 11 outside the bulb housing to increase light efficient. Furthermore, the cover 1501 is equipped with vias for the metal stem 14 and the metal conductive support 13 to penetrate. The driving circuit may be electrically connected to the plurality of LED filaments 11 by the metal conductive support 13, so as to provide the power to light the LED chips on the LED filaments 11. An input wire of the other terminal of the driving circuit is electrically connected to the bulb base 17 at the end of the LED light bulb 1.

Figure 11:
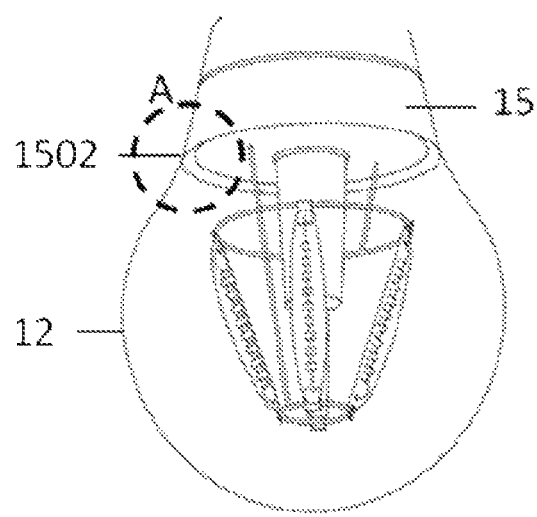
FIG. 11 is a schematic view of a light body connected to a heat dissipater of FIG. 10.
Figure 12:
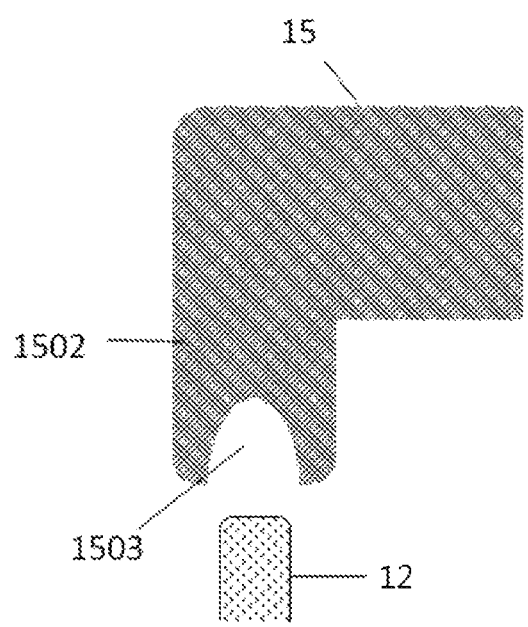
FIG. 12 is an enlarged view of an A area of FIG. 11.

As the above description, during the manufacturing process of the traditional light bulb, a horn stem may cover the opening of the glass bulb housing for seal sintering. Since the material of both of them is glass, they may be melted after a high temperature sintering to achieve a seal. However, the present disclosure use the metal stem 14, and thus the sintering seal effect of the metal and the glass does not achieve the effect like the glass horn stem. Therefore, in the present disclosure, a structure of the heat sink 15 connected to the metal stem 14 is adjusted to achieve the object for sealing the bulb housing of the light bulb. As shown in FIG. 11, the outline of the heat sink 15 is like a cap covering the opening of the bulb housing 12, and the edge thereof has a bending part 1502 and connected to a glass of the opening of the bulb housing 12. Please refer to FIG. 12, an intermediate of a port of the bending part 1502 has a concave part 1503, and a width thereof is slightly greater than a thickness of the glass of the opening of the bulb housing 12, and therefore, the whole opening of the bulb housing 12 may completely be covered and wrapped by the concave part 1503. A sealing sealant with good sealing property may be appropriately filled in the concave part 1503, so as to make the connection of the heat sink 15 and the bulb housing 12 more stable. A plastic bulb holder 16 may be added between the heat sink 15 and the bulb base 17, so as to maintain a safety of installation or unload for the person.

An arrangement manner of the plurality of LED filaments 11 may surround the metal stem 14 to present an arrangement with an upright symmetrical mode. However, considering a requirement of needs of light illuminated the entire circumference, the filament preferably needs adopting a diagonal manner rather than parallel to the metal stem 14. The LED chip assembly inside the LED filament 11 may appropriately select large chips and may be driven by the small current to light, so as to achieve the lower heat dissipation, such that the light efficiency of the LED filament 11 may exceed 180 lm/W, and the whole brightness of the LED light bulb may easily exceed 700 lm. In addition, for the whole light bulb, the best disposed location of the light source is near a sphere center of the bulb housing, all of the filament with excess length may not be disposed in this area, therefore more of the plurality of LED filament with short length are selected to achieve the better light illuminated the entire circumference effect. In the present disclosure, the length of the LED filament is less than 20 mm, preferably, 15~10 mm. Moreover, the light source is separated to a plurality of short filaments to disperse the thermal source; it may increase the whole thermal dissipation effect of the LED light bulb. Even if at the top location of the bulb housing 12, a variation rate of light is also much less than 50%, i.e. the brightness of the top of the bulb housing 12 is not less 50% of the brightness of the brightest position of the light bulb 1.

In the present disclosure, the above metal stem 14 may be changed to a ceramic stem, and the material of the ceramic stem is selected from aluminum oxide or aluminum nitride. The thermal radiation absorption rate thereof is much greater than the glass, and therefore heat generated by the LED filament may be absorbed effectively and the heat may be exhausted outside the LED light bulb 1. In other embodiment, the material of the heat sink 15 (together with the screw of the LED bulb 1) may be selected from the ceramic material with good thermal conductivity effect and may be integrally formed with the ceramic stem, so as to omit the thermal resistor of heat dissipation loop of the LED filament increased by gluing the screw of the LED light bulb and the heat sink 15, thereby having a better thermal dissipation effect.

In the embodiment, the luminous efficiency of the LED light blub is, for example, 30~400 lm/W, preferably, 50~250 lm/W. The total luminance of the LED light blub may be, for example, achieved to 800 lm. The color temperature of the LED light blub is, for example, 2200K~6500K, preferably, 2500K~4000K. In addition, the shape of the silicone gel wrapping the LED chip may be a square or a rectangular, and the vertical and horizontal ratio thereof is 1:1 to 1:100.

Finally, it should be noted that the above embodiments are merely provided for describing the technical solutions of the disclosure, but not intended to limit the disclosure. Although reference to the embodiments of the disclosure has been described in details, those skilled in the art will appreciate that the technical solutions described in the foregoing embodiments can be modified, or equivalently replaced for some technical features; and such modifications or replacements do not make the essence of the corresponding technical solutions depart from the spirit and scope of the technical implementation of the disclosure.

Although the present disclosure is illustrated and described with reference to specific embodiments, those skilled in the art will understand that many variations and modifications are readily attainable without departing from the spirit and scope thereof as defined by the appended claims and their legal equivalents.

What is claimed is:

1. A LED filament, comprising:
   a frame, wherein the frame is a bottomless frame;
   a metal electrode disposed on one side of the frame;
   a first fasten member formed on the frame and a second fasten member formed on the metal electrode; wherein the metal electrode having the second fasten member is placed on the first fasten member of the frame, thereby fastening the metal electrode on the frame; wherein one of the first fasten member and the second fasten member is a protrusion while the other one is a hole; and
   at least one LED chip disposed inside the frame and electrically connecting to the metal electrode.

2. The LED filament as claimed in claim 1, wherein the frame includes two holding side and two non-holding sides, and the metal electrode is disposed on one of the two holding sides.

3. The LED filament as claimed in claim 2, further wherein a holding platform is formed on the holding side that the metal electrode disposed on.

4. The LED filament as claimed in claim 2, wherein the holding platform is a concave.

5. The LED filament as claimed in claim 1, wherein the frame includes a plurality of auxiliary support, protruded from the two non-holding sides of the transparent frame to support the at least one LED chip.

6. The LED filament as claimed in claim 1, further comprising a wire electrically connecting the at least one LED chip to the metal electrode.

7. The LED filament as claimed in claim 1, further comprising a gel wrapping the at least one LED chip and the wire inside the frame.

8. The LED filament as claimed in claim 1, further comprising an auxiliary support for supporting the at least one LED chip and the wire.

9. The LED filament as claimed in claim 1, wherein the material of the frame is a thermostable and light transmissive material.

10. The LED filament as claimed in claim 1, wherein each sides of the at least one LED chip contacts gel comprising phosphor.

11. A LED light bulb, comprising:
    a bulb housing;
    a bulb base connected to the bulb housing;
    a driving circuit disposed in the bulb base; and
    an LED filament disposed inside the bulb housing and electrically connected the driving circuit,
    wherein the LED filament comprises a frame, a metal electrode disposed on one sides of the frame, a first fasten member formed on the frame and a second fasten member formed on the metal electrode, at least one LED chip disposed inside the frame and electrically connecting to the metal electrode; wherein the metal electrode having the second fasten member is placed on the first fasten member of the frame, thereby fastening the metal electrode on the frame; wherein one of the first fasten member and the second fasten member is a protrusion while the other one is a hole.

12. The LED light bulb as claimed in claim 11, wherein the frame includes two holding side and two non-holding sides, and the metal electrode is disposed on one of the two holding sides.

13. The LED light bulb as claimed in claim 12, further wherein a holding platform is formed on the holding side that the metal electrode disposed on.

14. The LED light bulb as claimed in claim 12, wherein the holding platform is a concave.

15. The LED light bulb as claimed in claim 11, wherein the frame includes a plurality of auxiliary support, protruded from the two non-holding sides of the transparent frame to support the at least one LED chip.

16. The LED light bulb as claimed in claim 11, further comprising a wire electrically connecting the at least one LED chip to the metal electrode.

17. The LED light bulb as claimed in claim 11, further comprising a gel wrapping the at least one LED chip and the wire inside the frame.

18. The LED light bulb as claimed in claim 11, further comprising an auxiliary support for supporting the at least one LED chip and the wire.

19. The LED light bulb as claimed in claim 11, wherein the material of the frame is a thermostable and light transmissive material.

20. The LED light bulb as claimed in claim 11, wherein each sides of the at least one LED chip contacts gel comprising phosphor.

* * * * *